(12) United States Patent
Lin et al.

(10) Patent No.: US 9,072,174 B2
(45) Date of Patent: Jun. 30, 2015

(54) ELECTRONIC DEVICE

(71) Applicants: Pei-Jen Lin, Taipei (TW); Wei-Chih Hsu, Taipei (TW); Sheng-Wei Wu, Taipei (TW); Chang-Hua Wei, Taipei (TW); Hui-Jou Tsai, Taipei (TW); Yao-Tsung Yeh, Taipei (TW); Kun-Hsin Liu, Taipei (TW); Wei-Hao Lan, Taipei (TW); Chun-Huang Yu, Taipei (TW); Pei-Yi Chu, Taipei (TW); Hong-Tien Wang, Taipei (TW); Shi-Kuan Chen, Taipei (TW)

(72) Inventors: Pei-Jen Lin, Taipei (TW); Wei-Chih Hsu, Taipei (TW); Sheng-Wei Wu, Taipei (TW); Chang-Hua Wei, Taipei (TW); Hui-Jou Tsai, Taipei (TW); Yao-Tsung Yeh, Taipei (TW); Kun-Hsin Liu, Taipei (TW); Wei-Hao Lan, Taipei (TW); Chun-Huang Yu, Taipei (TW); Pei-Yi Chu, Taipei (TW); Hong-Tien Wang, Taipei (TW); Shi-Kuan Chen, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 85 days.

(21) Appl. No.: 14/049,206

(22) Filed: Oct. 8, 2013

(65) Prior Publication Data

US 2014/0104782 A1    Apr. 17, 2014

Related U.S. Application Data

(60) Provisional application No. 61/715,267, filed on Oct. 17, 2012, provisional application No. 61/739,684, filed on Dec. 19, 2012.

(51) Int. Cl.
*G06F 1/16* (2006.01)
*H05K 7/02* (2006.01)

(52) U.S. Cl.
CPC ............... *H05K 7/02* (2013.01); *G06F 1/1684* (2013.01); *G06F 1/1632* (2013.01); *G06F 1/1669* (2013.01)

(58) Field of Classification Search
None
See application file for complete search history.

(56) References Cited

U.S. PATENT DOCUMENTS

| | | | | |
|---|---|---|---|---|
| 4,618,119 A | * | 10/1986 | Powell | 248/456 |
| 5,085,394 A | * | 2/1992 | Torii | 248/455 |
| 6,366,440 B1 | * | 4/2002 | Kung | 361/147 |
| 6,922,333 B2 | * | 7/2005 | Weng et al. | 361/679.2 |
| 7,239,505 B2 | * | 7/2007 | Keely et al. | 361/679.09 |
| 7,907,393 B2 | * | 3/2011 | Sellers | 361/679.27 |

(Continued)

FOREIGN PATENT DOCUMENTS

| TW | M413912 | 10/2011 |
|---|---|---|
| TW | M437646 | 9/2012 |

*Primary Examiner* — Adrian S Wilson
(74) *Attorney, Agent, or Firm* — Jianq Chyun IP Office

(57) ABSTRACT

An electronic device includes a first body and a second body. The first body includes a first main body and a first magnetic element fixed in the first main body. The second body includes a second main body, a supporting unit, a second magnetic element, and a third magnetic element. The second main body is adapted to hold the first body. The supporting unit is pivoted to the second main body. The second magnetic element is fixed in the second main body. The third magnetic element is slidably configured in the second main body to restrict a rotation of the supporting unit relative to the second main body. When the first body leans against the second main body, the third magnetic element is subject to a magnetic attraction force from the first magnetic element and escapes from the supporting unit, so that the supporting unit supports the first body.

9 Claims, 5 Drawing Sheets

(56) References Cited

U.S. PATENT DOCUMENTS

| | | | |
|---|---|---|---|
| 8,230,992 B2* | 7/2012 | Law et al. | 206/320 |
| 8,693,191 B2* | 4/2014 | Xu | 361/679.58 |
| 8,937,803 B2* | 1/2015 | Hung et al. | 361/679.08 |
| 2004/0114315 A1* | 6/2004 | Anlauff | 361/681 |
| 2006/0261605 A1* | 11/2006 | Ku et al. | 292/251.5 |
| 2007/0035917 A1* | 2/2007 | Hotelling et al. | 361/683 |
| 2007/0121303 A1* | 5/2007 | Wang et al. | 361/752 |
| 2007/0217135 A1* | 9/2007 | Chuang et al. | 361/681 |
| 2008/0232061 A1* | 9/2008 | Wang et al. | 361/686 |
| 2009/0103261 A1* | 4/2009 | Shih | 361/679.58 |
| 2010/0123663 A1* | 5/2010 | Leung et al. | 345/169 |
| 2010/0176698 A1* | 7/2010 | Wu et al. | 312/223.1 |
| 2010/0238620 A1* | 9/2010 | Fish | 361/679.09 |
| 2010/0321877 A1* | 12/2010 | Moser | 361/679.29 |
| 2013/0027872 A1* | 1/2013 | Lin et al. | 361/679.41 |
| 2013/0031289 A1* | 1/2013 | Yeh et al. | 710/303 |
| 2013/0094134 A1* | 4/2013 | Ashcraft et al. | 361/679.29 |
| 2013/0128453 A1* | 5/2013 | Lin | 361/679.56 |
| 2013/0162554 A1* | 6/2013 | Lauder et al. | 345/173 |
| 2013/0242490 A1* | 9/2013 | Ku | 361/679.3 |
| 2014/0313665 A1* | 10/2014 | Delpier et al. | 361/679.55 |

* cited by examiner

ELECTRONIC DEVICE

CROSS REFERENCE TO RELATED APPLICATION

This application claims the priority benefit of U.S. provisional application Ser. No. 61/715,267, filed on Oct. 17, 2012 and U.S. provisional application Ser. No. 61/739,684, filed on Dec. 19, 2012. The entirety of the above-mentioned patent application is hereby incorporated by reference herein and made a part of specification.

FIELD OF THE INVENTION

The invention relates to an electronic device; more particularly, the invention relates to an assembled electronic device.

DESCRIPTION OF RELATED ART

With rapid advance in science and technology, the types of tablet devices (e.g., tablet PCs) become more and more diverse. Portability and convenience of the tablet devices allow users to use computers on various working conditions. However, due to the requirements for compactness and light weight, functions and expandability of the tablet devices are slightly insufficient as compared to desktop computers or notebook computers.

In view of the above, a docking station that is often equipped with a keyboard has been developed according to the related art. The tablet device may be vertically arranged on the docking station, such that a user is allowed to operate the tablet device by means of the keyboard and observe the display frames displayed by the tablet device. That is, after the tablet device is assembled to the docking station, the tablet device may be used in the same manner as that of the notebook computer, and the functionality and the convenience of the tablet device can accordingly be enhanced.

SUMMARY OF THE INVENTION

The invention is directed to an electronic device of which a first body may be firmly fixed to the second body by means of magnetic attraction force between magnetic elements correspondingly arranged in the first and second bodies.

In an embodiment of the invention, an electronic device that includes a first body and a second body is provided. The first body includes a first main body and a first magnetic element fixed in the first main body. The second body includes a second main body, a supporting unit, a second magnetic element, and a third magnetic element. The second main body is adapted to hold the first body. The supporting unit is pivoted to the second main body. The second magnetic element is fixed in the second main body. The third magnetic element is slidably configured in the second main body to restrict a rotation of the supporting unit relative to the second main body. When the first body leans against the second main body, the third magnetic element is subject to a magnetic attraction force from the first magnetic element and escapes from the supporting unit, such that the supporting unit supports the first body.

According to an embodiment of the invention, the first body is a tablet computer, and the second body is a docking station.

According to an embodiment of the invention, the second body further includes a restoration element. The restoration element is located between the second main body and the supporting unit, such that the supporting unit rotates by a predetermined angle relative to the second main body.

According to an embodiment of the invention, the restoration element is a torsion spring.

According to an embodiment of the invention, the supporting unit has a supporting locking portion, the third magnetic element includes a magnetic portion and a sliding locking portion that is connected to the magnetic portion, and the sliding locking portion subject to a magnetic repulsive force between the second magnetic element and the magnetic portion is coupled to the supporting locking portion.

According to an embodiment of the invention, when the electronic device leans against the second main body, the first body subject to a magnetic attraction force between the first magnetic element and the second magnetic element is attracted to the second main body, and the sliding locking portion subject to a magnetic attraction force between the first magnetic element and the magnetic portion escapes from the supporting locking portion.

According to an embodiment of the invention, a magnetic attraction force between the first magnetic element and the magnetic portion is greater than the magnetic repulsive force between the second magnetic element and the magnetic portion.

According to an embodiment of the invention, the second main body has an accommodation portion, and the third magnetic element subject to a magnetic repulsive force from the second magnetic element leans against the supporting unit, such that the supporting unit is located in the accommodation portion.

According to an embodiment of the invention, the first body further includes a first connection port fixed in the first main body. The second body further includes a second connection port corresponding to the first connection port. The second connection port is fixed in the second main body. When the second main body holds the first main body, the first connection port and the second connection port are electrically connected to each other.

As discussed above, the first body is firmly fixed to the second body by means of the magnetic attraction force between the magnetic elements correspondingly arranged in the first and second bodies. Besides, after the first body is assembled to the second body, the restriction of the rotation of the supporting unit of the second body relative to the second main body is released. Thereby, the restoration element drives the supporting unit to rotate by a predetermined angle relative to the second main body for supporting the first body, such that the electronic device is not apt to shake during its operation.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
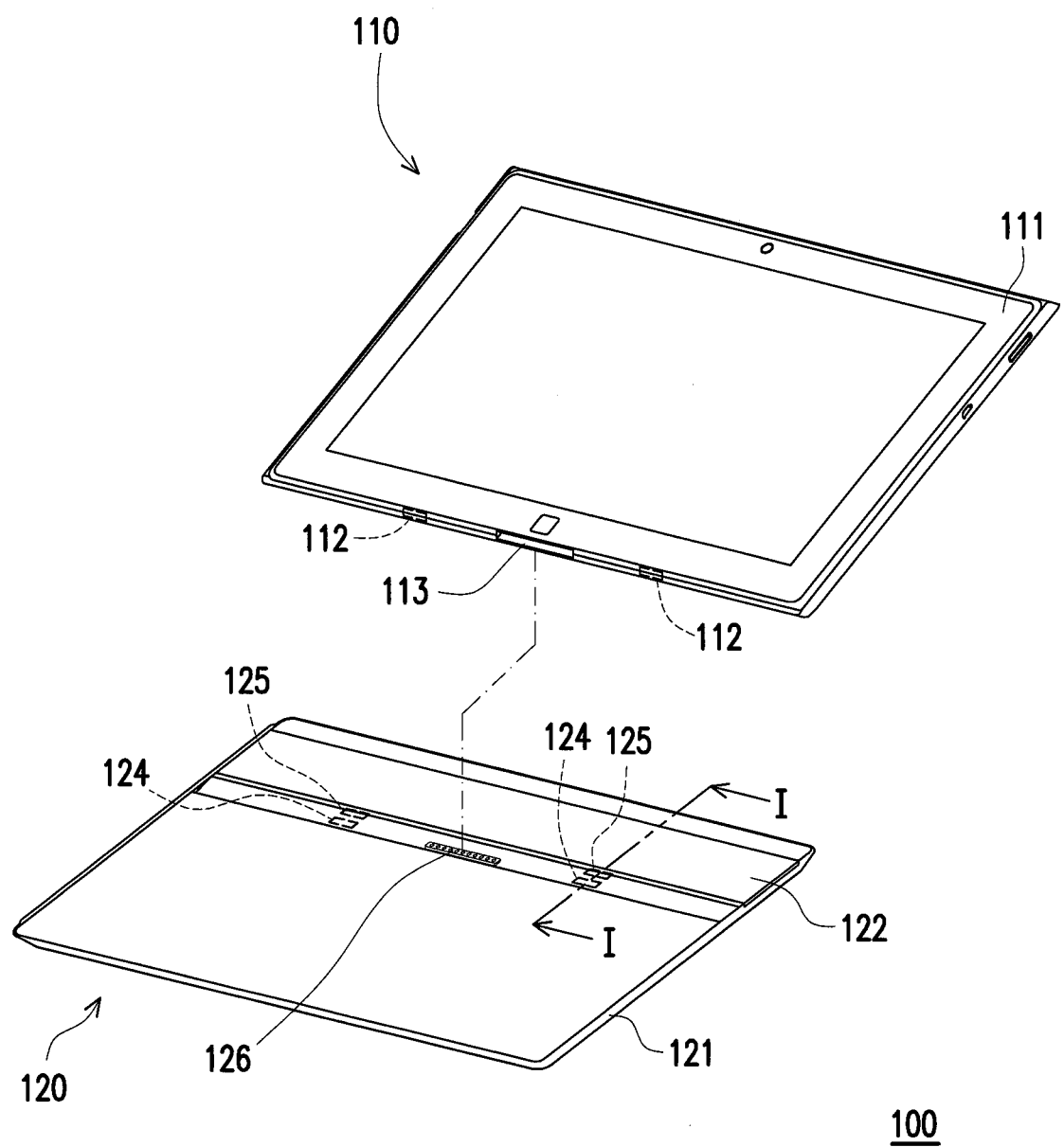
FIG. 1 is a schematic three-dimensional view illustrating an electronic device before assembly according to an embodiment of the invention.

FIG. 1 is a schematic three-dimensional view illustrating an electronic device before assembly according to an embodiment of the invention. With reference to FIG. 1, the electronic device 100 includes a first body 110 and a second body 120. The first body 110 is a tablet computer, for instance; alternatively, the first body 110 may be another display device capable of performing a touch-control function or not. The second body 120 is, for instance, a docking station equipped with a keyboard, such that a user may use the keyboard after the first and second bodies 110 and 120 are assembled.

In the present embodiment, the first body 110 includes a first main body 111 and a first magnetic element 112. The first magnetic element 112 in pairs is fixed in the first main body 111 and located on at least one side of the first main body 111, for instance. Here, the first magnetic element 112 is a metal magnet or a plastic magnet having corresponding magnetic poles N and S, for instance. It should be mentioned that the number and the location of the first magnetic element 112 are not limited in the invention and may be adjusted according to actual design requirements.

Figure 2:
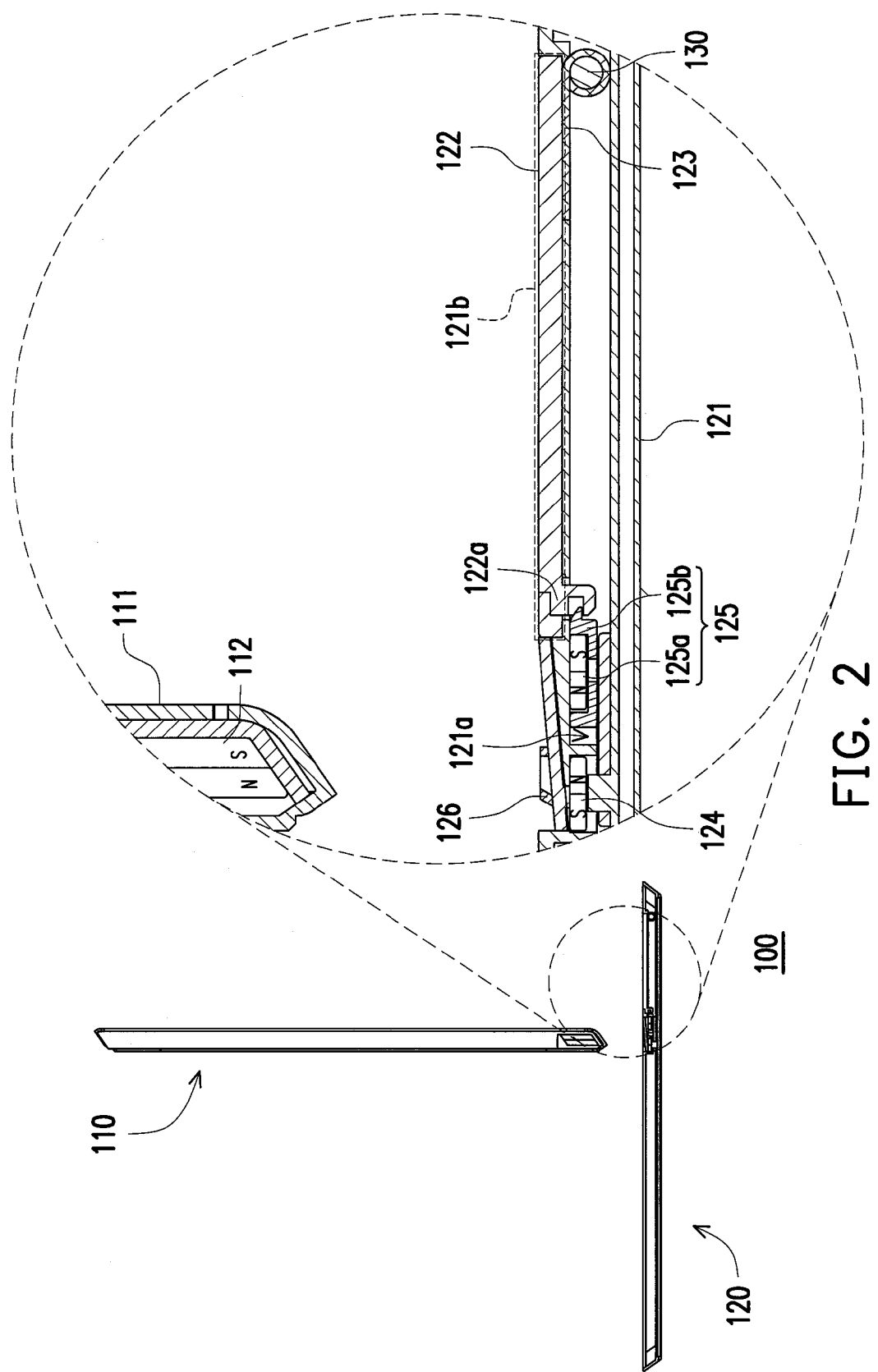
FIG. 2 to FIG. 4 are cross-sectional views illustrating a process of assembling the first body and the second body depicted in FIG. 1.
Figure 3:
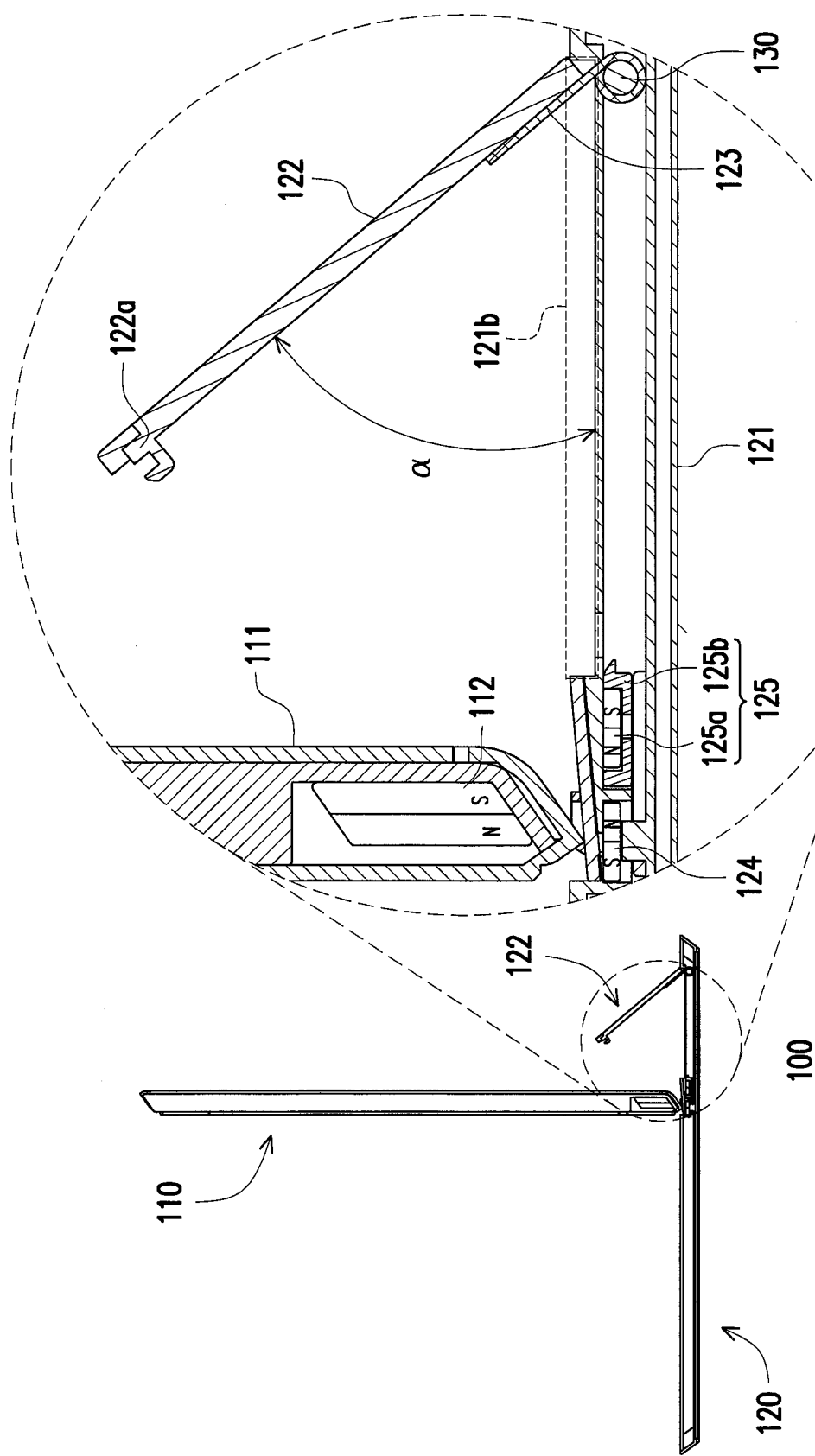
Figure 4:
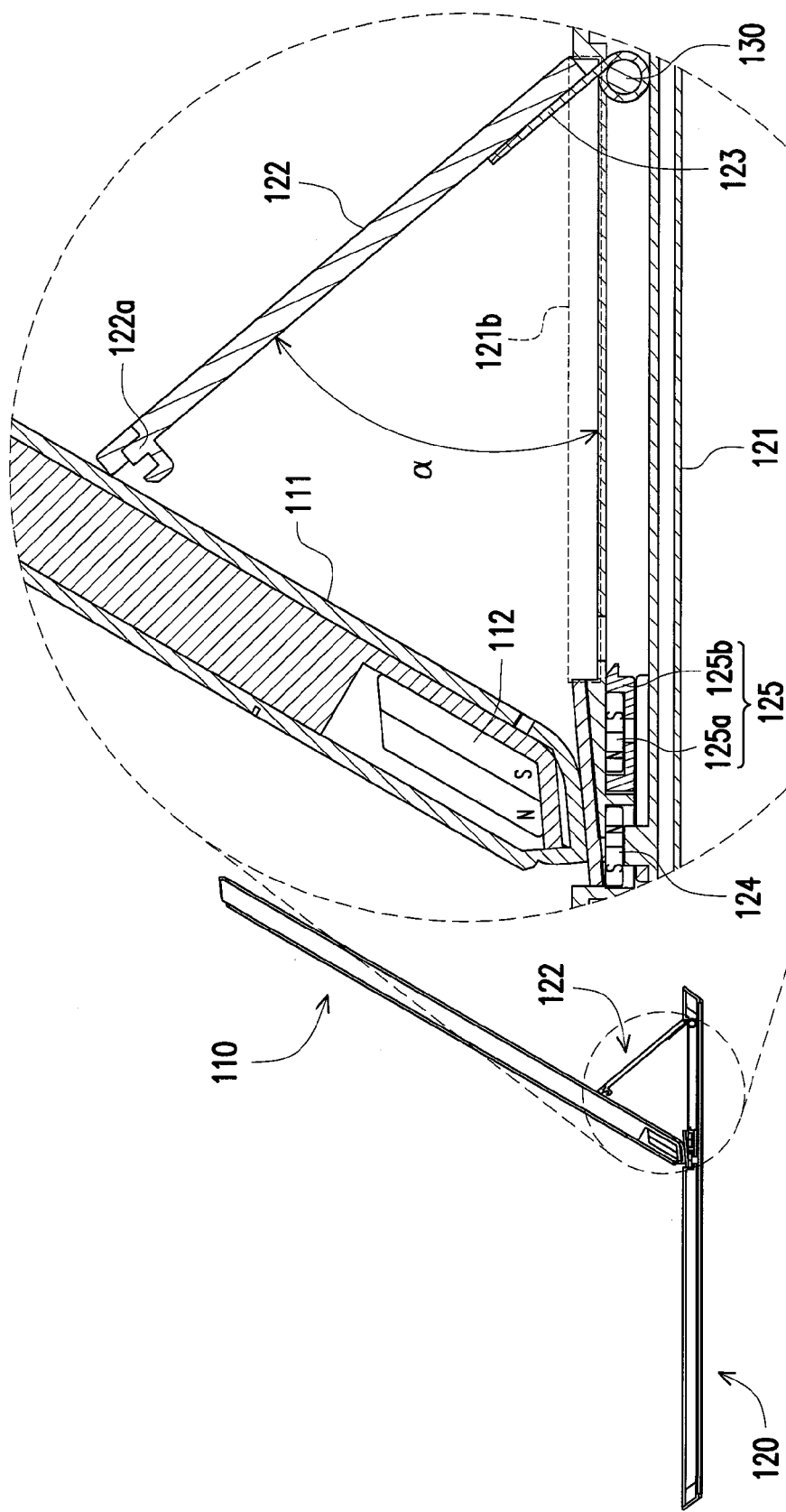
Figure 5:
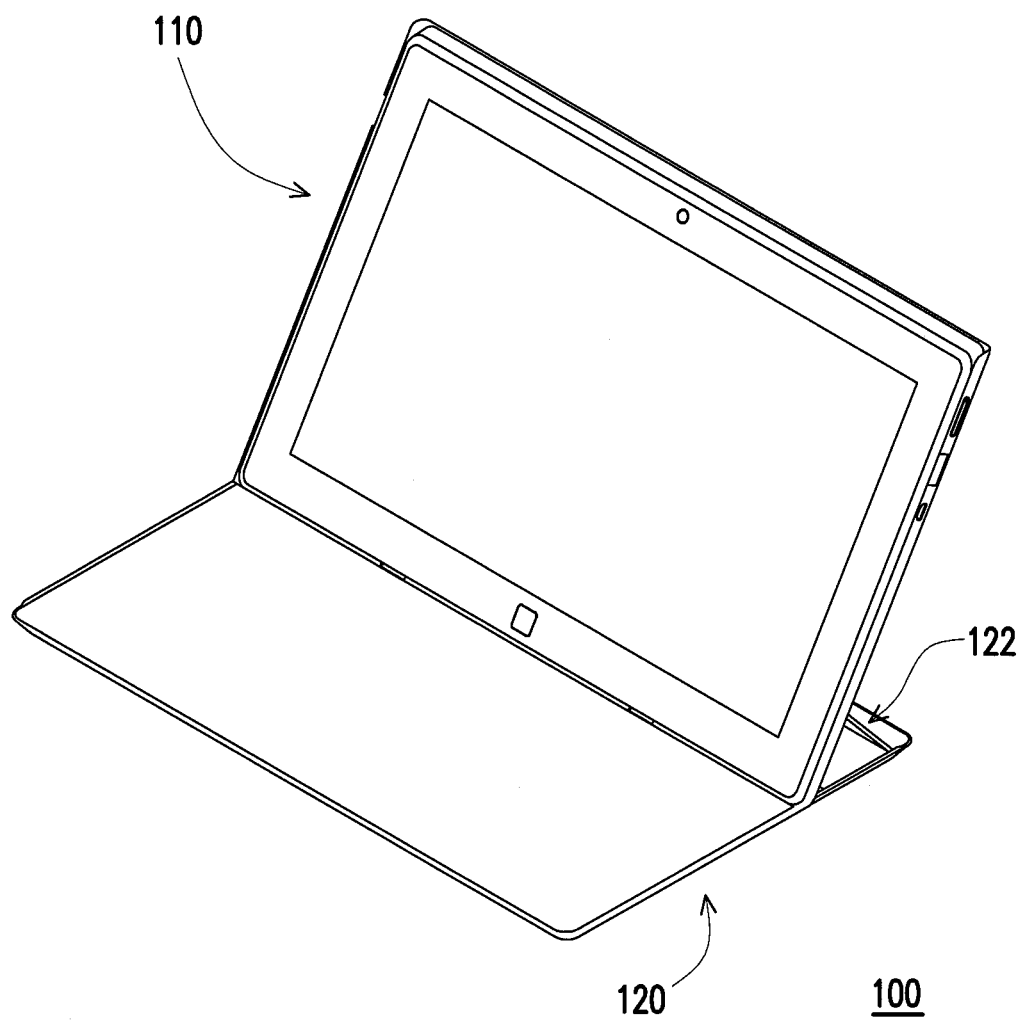
FIG. 5 is a schematic three-dimensional view illustrating the first body and the second body depicted in FIG. 1 after assembly.

FIG. 2 to FIG. 4 are cross-sectional views illustrating a process of assembling the first body and the second body depicted in FIG. 1. FIG. 5 is a schematic three-dimensional view illustrating the first body and the second body depicted in FIG. 1 after assembly. With reference to FIG. 1 and FIG. 2, in the present embodiment, the second body 120 includes a second main body 121, a supporting unit 122, a restoration element 123, a second magnetic element 124, and a third magnetic element 125. The second main body 121 is adapted to hold the first body 110. The supporting unit 122 is pivoted to the second main body 121 and has a plate-shaped structure made of metal or plastic, for instance. Specifically, the supporting unit 122 is pivoted to the second main body 121 by means of a pivoting element 130, such that the supporting unit 122 is able to rotate. The restoration element 123 is located between the second main body 121 and the supporting unit 122, and the pivoting element 130 rotatably covers the supporting unit 122.

In the present embodiment, the restoration element 123 is a torsion spring for driving the supporting unit 122 to rotate relative to the second main body 121, for instance. The second magnetic element 124 in pairs is fixed in the second main body 121, and the third magnetic element 125 in pairs is slidably arranged in the second main body 121, for instance. Here, the second and third magnetic elements 124 and 125 are metal magnets, each of which has corresponding magnetic poles N and S. It should be mentioned that the number and the locations of the second and third magnetic elements 124 and 125 are not limited in the invention and may be adjusted according to actual design requirements.

The third magnetic element 125 is slidably arranged in a sliding groove 121a in the second main body 121, for instance. Here, a magnetic repulsive force is in principle generated by the corresponding like magnetic poles of the second and third magnetic elements 124 and 125. According to the present embodiment, the magnetic poles N of the second and third magnetic elements 124 and 125 correspond to each other, which is merely exemplary and should not be construed as a limitation to the invention.

The third magnetic element 125 subject to the magnetic repulsive force from the second magnetic element 124 leans against the supporting unit 122, such that the supporting unit 122 driven by the restoration element 123 is restricted not to rotate relative to the second main body 121. In addition, the supporting unit 122 may also be placed in an accommodation portion 121b of the second main body 121, which allows the uniform exterior presentation of the second body 120.

In particular, the supporting unit 122 described in the present embodiment has a supporting locking portion 122a, and the third magnetic element 125 includes a magnetic portion 125a (having the corresponding magnetic poles N and S) and a sliding locking portion 125b that is connected to the magnetic portion 125a. The supporting locking portion 122a has a groove corresponding to the sliding locking portion 125b, and the sliding locking portion 125b subject to a magnetic repulsive force between the second magnetic element 124 and the magnetic portion 125a is coupled to the supporting locking portion 122a. That is, at least parts of the sliding locking portion 125b is moved into the groove of the supporting locking portion 122a, so as to stop the rotation of the supporting unit 122 relative to the second main body 121.

With reference to FIG. 3, in the present embodiment, if one side of the first body 110 having the first magnetic element 112 leans against the second main body 121, the location of the magnetic poles N and S of the first magnetic element 112 are corresponding to the location of the magnetic poles N and S of the second magnetic element 124, such that the first body 110 is assembled to the second body 121 by means of the magnetic attraction force between the first and second magnetic elements 112 and 124.

In another aspect, as shown in FIG. 1, the first body 110 further includes a first connection port 113 that is fixed in the first main body 111. The second body 120 further includes a second connection port 126 corresponding to the first connection port 113, and the second connection port 126 is fixed in the second main body 121. When the second main body 121 holds the first main body 111, the first connection port 113 and the second connection port 126 are electrically connected to each other. Specifically, the first and second connection ports 113 and 126 may have corresponding protrusions and recesses for aligning and assembling the first and second bodies 110 and 120 and ensuring the electrical connection between the first and second connection ports 113 and 126.

With reference to FIG. 3, the magnetic attraction force between the first magnetic element 112 and the magnetic portion 125a of the third magnetic element 125 is greater than the magnetic repulsive force between the second magnetic element 124 and the magnetic portion 125a. Therefore, the third magnetic element 125 slidably configured in the sliding groove 121a is subject to the magnetic attraction force from the first magnetic element 121, and thus the third magnetic element 125 moves toward the second magnetic element 124 and escapes from the supporting unit 122. That is, the sliding locking portion 125b is moved out of the groove of the supporting locking portion 122a, such that the interference between the sliding locking portion 125b and the supporting locking portion 122a is removed. The restoration element 123 may then drive the supporting unit 122 to rotate by a predetermined angle α relative to the second main body 121.

With reference to FIG. 4 and FIG. 5, after the supporting unit 122 rotates by the predetermined angle α relative to the second main body 121, the first body 110 may lean against the supporting locking portion 122a of the supporting unit 122. Namely, the second body 120 may hold the first body 110 by means of the supporting unit 122, so as to provide the user with an appropriate viewing angle for the user's comfort. In addition, since there is a magnetic attraction force between the first and second magnetic elements 112 and 124, and the first body 110 leans against the supporting unit 122, the electronic device in use is not apt to shake.

To sum up, the first body is firmly fixed to the second body by means of the magnetic attraction force between the magnetic elements correspondingly arranged in the first and second bodies. Besides, after the first body is assembled to the second body, the restriction of the rotation of the supporting unit of the second body relative to the second main body is released. Thereby, the restoration element drives the supporting unit to rotate by a predetermined angle relative to the second main body for supporting the first body, such that the electronic device is not apt to shake during its operation. Moreover, the magnetic elements and the restoration element allow the first body (relative to the second body) to be held by the supporting unit while the first body is assembled to the second body.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. An electronic device comprising:
   a first body comprising:
      a first main body; and
      a first magnetic element fixed in the first main body; and
   a second body comprising:
      a second main body adapted to hold the first body;
      a supporting unit pivoted to the second main body;
      a second magnetic element fixed in the second main body; and
      a third magnetic element slidably configured in the second main body to restrict a rotation of the supporting unit relative to the second main body, wherein when the first body leans against the second main body, the third magnetic element is subject to a magnetic attraction force from the first magnetic element and escapes from the supporting unit, such that the supporting unit supports the first body.

2. The electronic device as recited in claim 1, wherein the first body is a tablet computer, and the second body is a docking station.

3. The electronic device as recited in claim 1, wherein the second body further comprises a restoration element located between the second main body and the supporting unit, such that the supporting unit rotates by a predetermined angle relative to the second main body.

4. The electronic device as recited in claim 3, wherein the restoration element is a torsion spring.

5. The electronic device as recited in claim 1, wherein the supporting unit has a supporting locking portion, the third magnetic element comprises a magnetic portion and a sliding locking portion connected to the magnetic portion, and the sliding locking portion subject to a magnetic repulsive force between the second magnetic element and the magnetic portion is coupled to the supporting locking portion.

6. The electronic device as recited in claim 5, wherein when the electronic device leans against the second main body, the first body subject to a magnetic attraction force between the first magnetic element and the second magnetic element is attracted to the second main body, and the sliding locking portion subject to a magnetic attraction force between the first magnetic element and the magnetic portion escapes from the supporting locking portion.

7. The electronic device as recited in claim 5, wherein a magnetic attraction force between the first magnetic element and the magnetic portion is greater than the magnetic repulsive force between the second magnetic element and the magnetic portion.

8. The electronic device as recited in claim 1, wherein the second main body has an accommodation portion, and the third magnetic element subject to a magnetic repulsive force from the second magnetic element leans against the supporting unit, such that the supporting unit is located in the accommodation portion.

9. The electronic device as recited in claim 1, wherein the first body further comprises a first connection port fixed in the first main body, the second body further comprises a second connection port corresponding to the first connection port, the second connection port is fixed in the second main body, and when the second main body holds the first main body, the first connection port and the second connection port are electrically connected to each other.

* * * * *